(12) United States Patent
Lee et al.

(10) Patent No.: US 6,870,736 B2
(45) Date of Patent: Mar. 22, 2005

(54) HEAT SINK AND PACKAGE SURFACE DESIGN

(75) Inventors: Seri Lee, Beaverton, OR (US); Phillip H. Chen, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/857,298

(22) Filed: May 28, 2004

(65) Prior Publication Data

US 2004/0218354 A1 Nov. 4, 2004

Related U.S. Application Data

(63) Continuation of application No. 10/205,842, filed on Feb. 26, 2002, now Pat. No. 6,757,170.

(51) Int. Cl.[7] ................................................. H05K 7/20
(52) U.S. Cl. ........................ 361/704; 361/719; 257/706; 257/717; 165/80.3; 165/185
(58) Field of Search ................................. 361/704, 707, 361/709, 710, 717–719; 257/706, 712; 174/16.3; 165/80.2, 80.3, 185

(56) References Cited

U.S. PATENT DOCUMENTS

| | | | |
|---|---|---|---|
| 5,168,926 A | 12/1992 | Watson et al. | 165/185 |
| 5,276,586 A | 1/1994 | Hatsuda et al. | 361/387 |
| 5,471,027 A | 11/1995 | Call et al. | 219/85.13 |
| 5,623,394 A | 4/1997 | Sherif et al. | 361/705 |
| 5,905,636 A | 5/1999 | Baska et al. | 361/705 |
| 5,907,474 A | 5/1999 | Dolbear | 361/705 |
| 5,985,697 A | 11/1999 | Chaney et al. | 438/122 |
| 6,218,730 B1 | 4/2001 | Toy et al. | 257/704 |
| 6,223,815 B1 * | 5/2001 | Shibasaki | 165/185 |
| 6,294,408 B1 | 9/2001 | Edwards et al. | 438/121 |
| 6,376,907 B1 * | 4/2002 | Takano et al. | 257/704 |
| 6,411,507 B1 * | 6/2002 | Akram | 361/690 |
| 6,444,496 B1 * | 9/2002 | Edwards et al. | 438/122 |
| 6,570,764 B2 | 5/2003 | Bhatia et al. | 361/705 |
| 6,752,204 B2 * | 6/2004 | Dishongh et al. | 165/185 |

* cited by examiner

Primary Examiner—Boris Chervinsky
(74) Attorney, Agent, or Firm—Schwegman, Lundberg, Woessner & Kluth, P.A.

(57) ABSTRACT

An electronic assembly that includes a heat sink, a thermal interface material, integrated circuit, and a package connected to the integrated circuit. The thermal interface material is positioned between a first surface on the package and a second surface on the heat sink to improve thermal conductivity between the package and heat sink. At least one of the first and second surfaces includes either a cavity that traps excess thermal interface material when the heat sink is compressed against the package.

20 Claims, 6 Drawing Sheets

HEAT SINK AND PACKAGE SURFACE DESIGN

This application is a continuation of U.S. patent application Ser. No. 10/205,842, filed on Jul. 26, 2002 now U.S. Pat. No. 6,757,170, which is incorporated herein by reference.

TECHNICAL FIELD OF THE INVENTION

The present invention relates to an electronic assembly that includes a thermal interface material sandwiched between a heat sink and an integrated circuit package.

BACKGROUND

Electronic devices generate heat during operation. Thermal management refers to the ability to keep temperature-sensitive elements in an electronic device within a prescribed operating temperature.

Historically, electronic devices have been cooled by natural convection. The cases or packaging of the devices included strategically located openings (e.g., slots) that allow warm air to escape and cooler air to be drawn in.

The development of high performance electronic devices, such as processors, now requires more innovative thermal management. Each increase in processing speed and power generally carries a "cost" of increased heat generation such that natural convection is no longer sufficient to provide proper thermal management.

One common method of cooling electronic devices includes thermally coupling a heat sink to the package of the electronic device. A typical heat sink includes protrusions such as fins or pins that project from a body of the heat sink. The protrusions give the heat sink a larger surface area such that the heat sink dissipates a greater amount of heat from the package into the surrounding environment. Heat sinks are fabricated from materials with high thermal conductivity in order to efficiently transfer thermal energy from the electronic device package.

FIG. 1 shows a prior art electronic assembly 6. Electronic assembly 6 includes an integrated circuit such as die 8 that is secured within an integrated circuit package 14. Integrated circuit package 14 is typically soldered or plugged into a motherboard on a computer. Integrated circuit package 14 includes a heat spreader 12 that is connected to a heat sink 10. Heat sink 10 cools the integrated circuit package 14 during the operation of an electronic system that includes die 8.

A thermal interface material 16 is sometimes used to promote an effective thermal path between heat spreader 12 and heat sink 10. Thermal interface material 16 is typically in the form of a paste or tape.

New thermal interface materials with higher thermal conductivities are continually being developed to meet the requirements for more efficient heat removal. These improved materials are necessary to keep the next generation of processors operating at lower temperatures.

Some of the new thermal interface materials are phase-change materials. These new phase-change materials have been proven to be thermally superior to other types of thermal interface materials.

As used herein, a phase change thermal interface material is a material that changes from solid to liquid when its temperature is raised above a certain level. The phase transition temperature of thermal interface material 46 is below the operating temperature of the junction between heat sink 10 and integrated circuit package 14 but above ambient temperature such that there is a transition from solid to liquid. As thermal interface material 16 changes to a liquid, it flows into the cracks in heat sink 10 and heat spreader 12. When thermal interface material 16 cools below a certain temperature, it turns permanently back into a solid.

Heat sink 10 is typically compressed against heat spreader 12 by adhesives, screws, and/or bolts. Another common method uses one or more clips to compress heat sink 10 against heat spreader 12.

Compressing heat sink 10 against integrated circuit package 14 decreases the thermal impedance between integrated circuit package 14 and heat sink 10. However, the new phase-change materials are often squeezed, or squished, out from between heat sink 10 and heat spreader 12.

FIG. 2 shows a compressive force (designated by arrow A) applied to heat sink 10 and integrated circuit package 14. Thermal interface material 16 tends to squish out the sides as it changes from solid to liquid, since it is sandwiched between two flat surfaces on heat sink 10 and heat spreader 12. Larger compressive forces generate more leakage. Containing thermal interface material 16 is particularly critical when metal-based, electrically conductive, low-melting temperature alloys are used as thermal interface material 16. The escaping thermal interface material 16 forms droplets 18 that can drip off the electronic assembly 6 onto a surface of a substrate such as a printed circuit board. If the droplets 18 fall onto the substrate, they may contaminate one or more electrical pathways.

The flat mating surfaces on heat sink 10 and heat spreader 12 come into contact as heat sink 10 engages heat spreader 12. Therefore, electronic assembly 6 does not include the ability to maintain bond line thickness between heat sink 10 and heat spreader 12 or align heat sink 10 relative to heat spreader 12. Maintaining bond line thickness between heat sink 10 and heat spreader 12 would be desirable because a pre-specified volume of the thermal interface material could be contained between heat sink 10 and integrated circuit package 14.

There is a need for an electronic assembly that adequately maintains a thermal interface material between a heat sink and an integrated circuit package. In addition, any improved electronic assembly should be able to control bond line thickness between the heat sink and integrated circuit package. Interlocking the heat sink and integrated circuit at least partially together would also be desirable.

DETAILED DESCRIPTION

Figure 1:
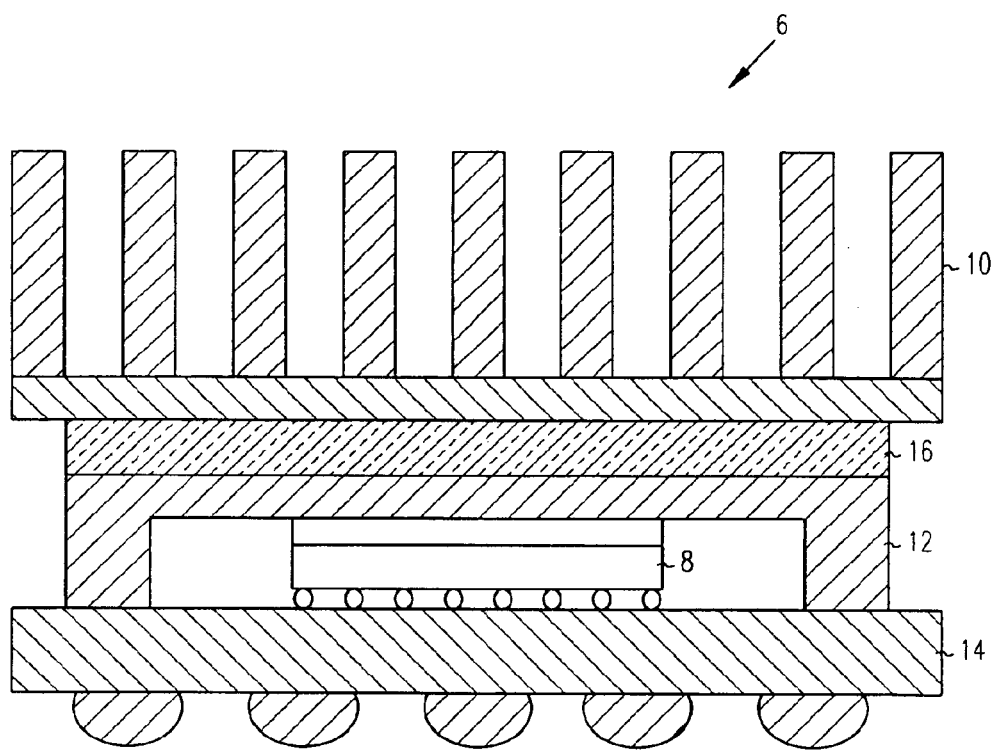
FIG. 1 is a simplified cross-section of a prior art electronic assembly.
Figure 2:
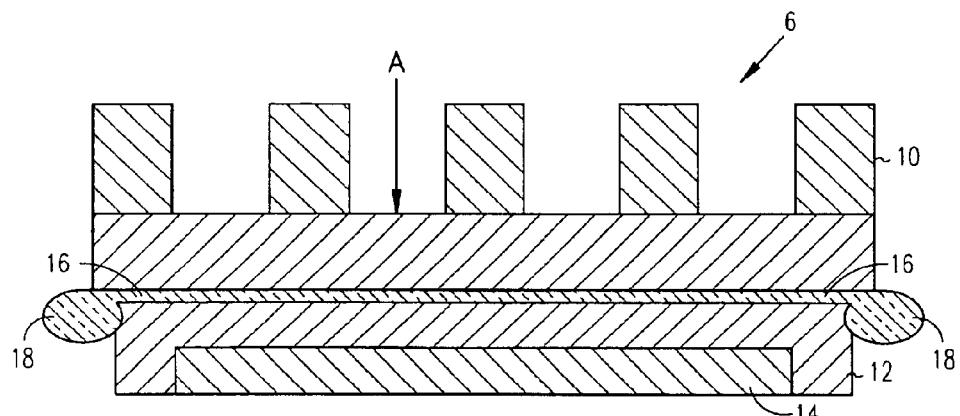
FIG. 2 is a simplified cross-section of a portion of the prior art electronic assembly shown in FIG. 1.

The following detailed description of the invention references the accompanying drawing that shows specific embodiments in which the invention may be practiced. Like numerals describe substantially similar components throughout each of the several views that make up the drawing. Other embodiments may be used, and structural, logical, and electrical changes made, without departing from the scope of the invention.

According to some embodiments of the present invention, an electronic assembly includes a thermal interface material that is sandwiched between a heat sink and an integrated circuit package. New low-melting temperature thermal interface materials that are made of metal-based alloys outperform conventional polymer based thermal interface materials. However, these metal-based phase-change materials are electrically conductive such that the squish-out phenomenon is a roadblock preventing electronics manufacturers from taking advantage of these materials, in spite of their high thermal performance, due to possible contamination. The electronic assembly according to some embodiments of the present utilizes these new materials to improve electronic device performance without any of associated problems that typically result from using such materials.

Figure 3:
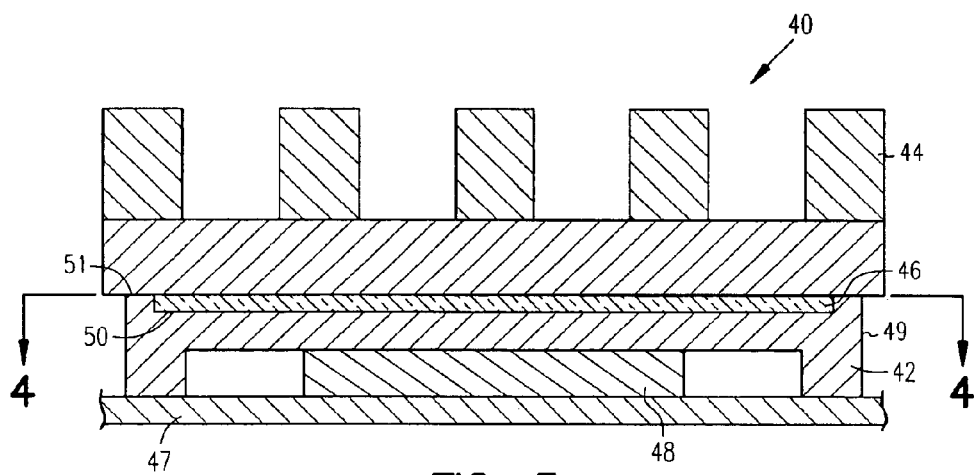
FIG. 3 is a simplified cross-section illustrating an electronic assembly of the present invention.

FIG. 3 illustrates an electronic assembly 40 of the present invention. Electronic assembly 40 includes an integrated circuit package 42 that is thermally connected to a heat sink 44 by a thermal interface material 46. In the illustrated example embodiment, integrated circuit package 42 includes a substrate 47 and a die 48 mounted to substrate 47. Integrated circuit package 42 further includes a heat spreader 49 that conducts heat away from die 48. Heat sink 44 thermally conducts heat away from heat spreader 49 in order to cool integrated circuit package 42 as die 48 generates heat during operation.

Figure 4:
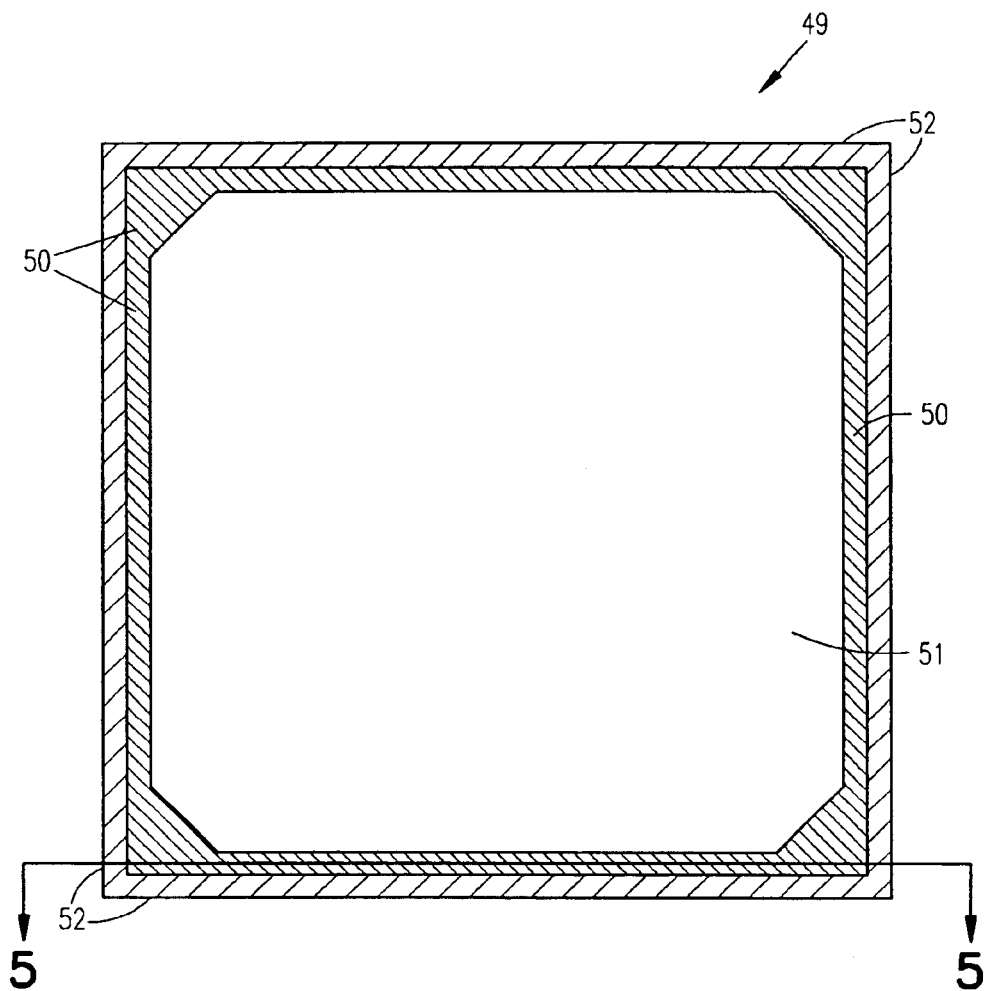
FIG. 4 is a simplified cross-section of the electronic assembly shown in FIG. 3 taken along line 4—4.
Figure 5:
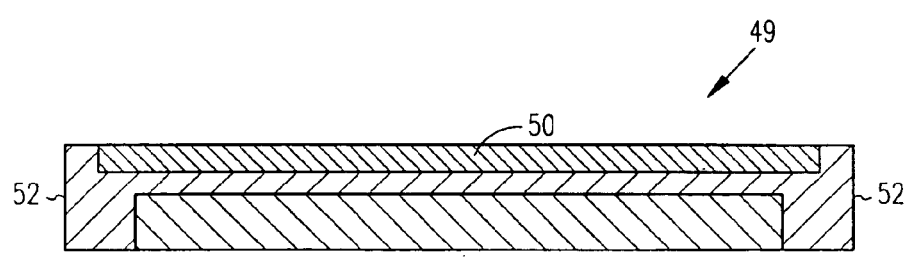
FIG. 5 is a simplified cross-section of the electronic assembly shown in FIG. 4 taken along line 5—5.

As also shown in FIGS. 4 and 5, spreader 49 includes a cavity 50 that extends into a first surface 51 on heat spreader 49. Cavity 50 acts as reservoir to collect any excessive thermal interface material 46 that is being pushed out towards the sides when heat sink 44 and heat spreader 49 are compressed together.

Figure 10:
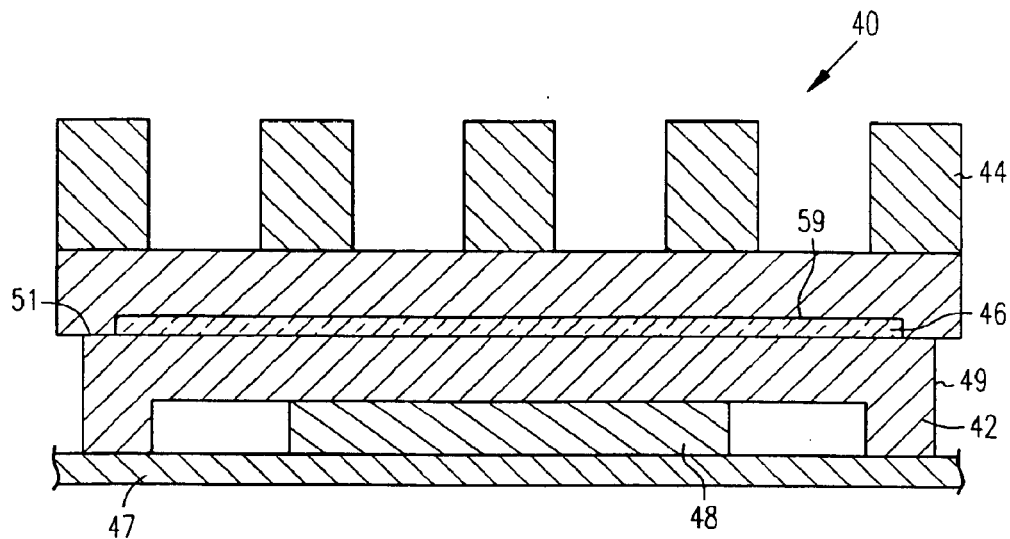
FIG. 10 is a simplified cross-section view illustrating another example embodiment of an electronic assembly encompassing the present invention.
Figure 11:
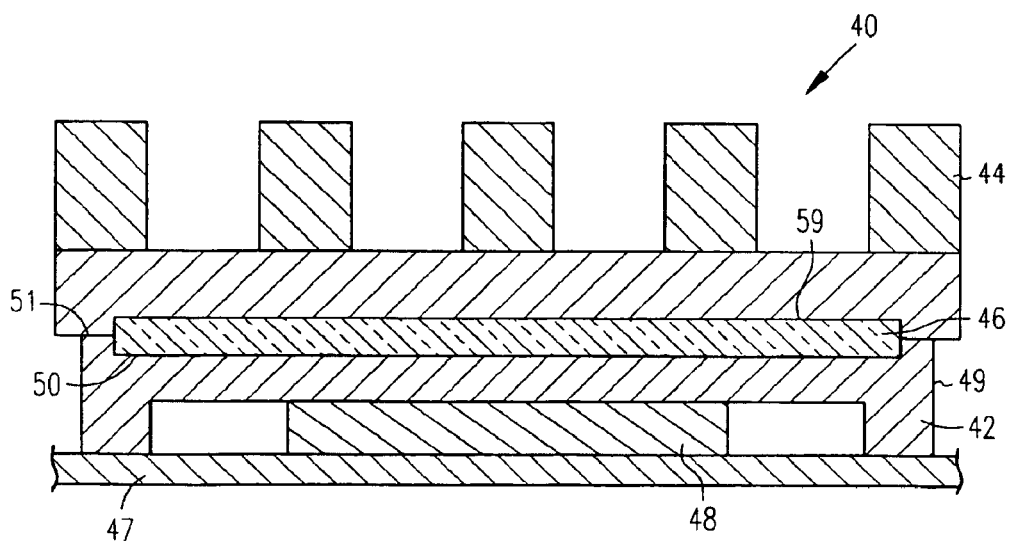
FIG. 11 is a simplified cross-section view illustrating yet another example embodiment of an electronic assembly encompassing the present invention.

In one embodiment cavity 50 is concentric with, and near, each outer edge 52 on first surface 51. The shape, width and depth of cavity 50 depends on the design and type of, thermal interface material 46, heat sink 44 and heat spreader 49. Heat spreader 49 may include more than one cavity 50, and heat sink 44 may include one or more cavities 56 (FIG. 10) in addition to (FIG. 11), or instead of, any cavities 50 in heat spreader 49.

Figure 6:
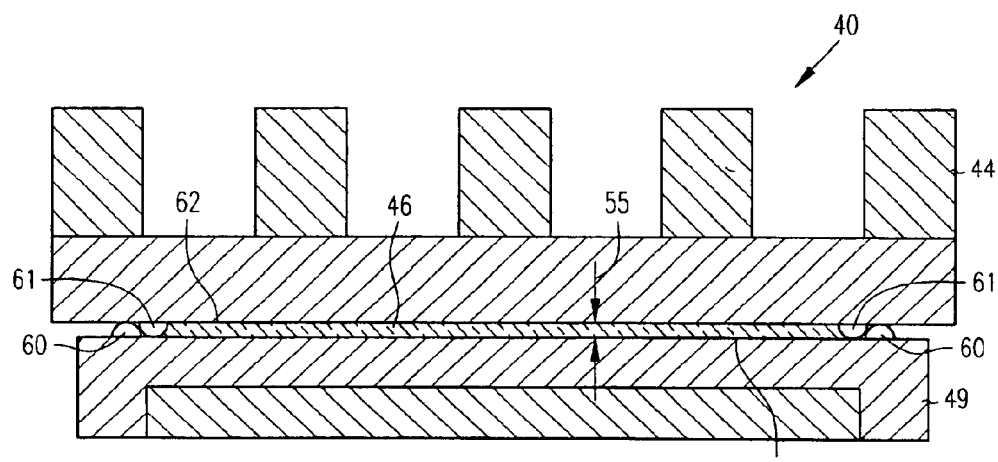
FIG. 6 is a simplified cross-section view illustrating another embodiment of an electronic assembly encompassing the present invention.

FIG. 6 shows an alternative embodiment of electronic assembly 40. A protrusion 60 extends from first surface 51 on heat spreader 49 and a similar protrusion 61 extends from a second surface 62 on heat sink 44. In some embodiments, the protrusions 60, 61 on heat spreader 49 and heat sink 44 are aligned with one another such that they engage one another when heat sink 44 is assembled to heat spreader 49.

As the protrusions 60, 61 engage one another, they align heat spreader 49 and heat sink 44, and provide interlocking between heat sink 44 and heat spreader 49.

The protrusions 60, 61 also enclose thermal interface material 46 such that protrusions 60, 61 contain thermal interface material 46 as it is transformed from a solid to a liquid during the initial operation of die 48. In addition, protrusions 60, 61 control bond line thickness 55 between first surface 51 on heat sink 44 and second surface 62 on heat spreader 49 as heat sink 44 engages heat spreader 49. The protrusions 60, 61 do not permit first surface 51 to fully contact second surface 62.

Figure 8:
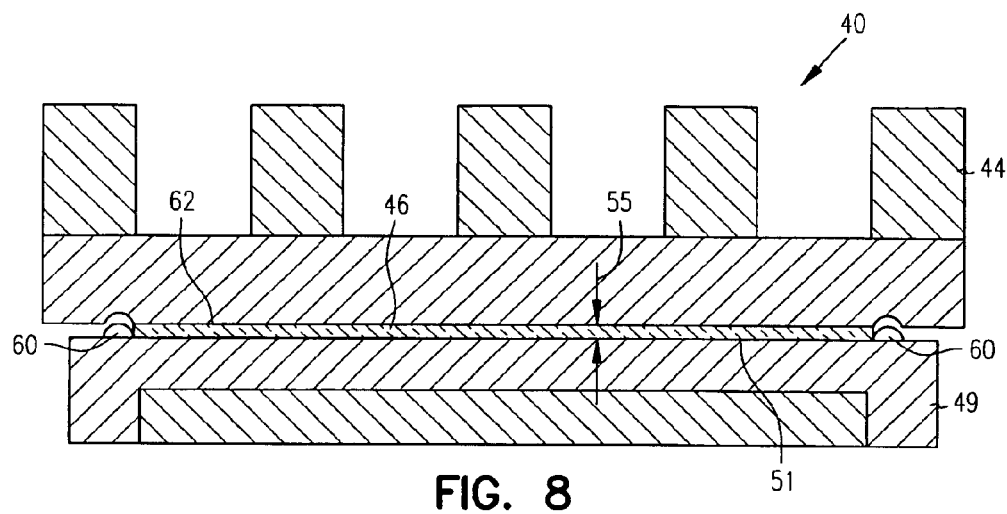
FIG. 8 is a simplified cross-section view illustrating another example embodiment of an electronic assembly encompassing the present invention.
Figure 9:
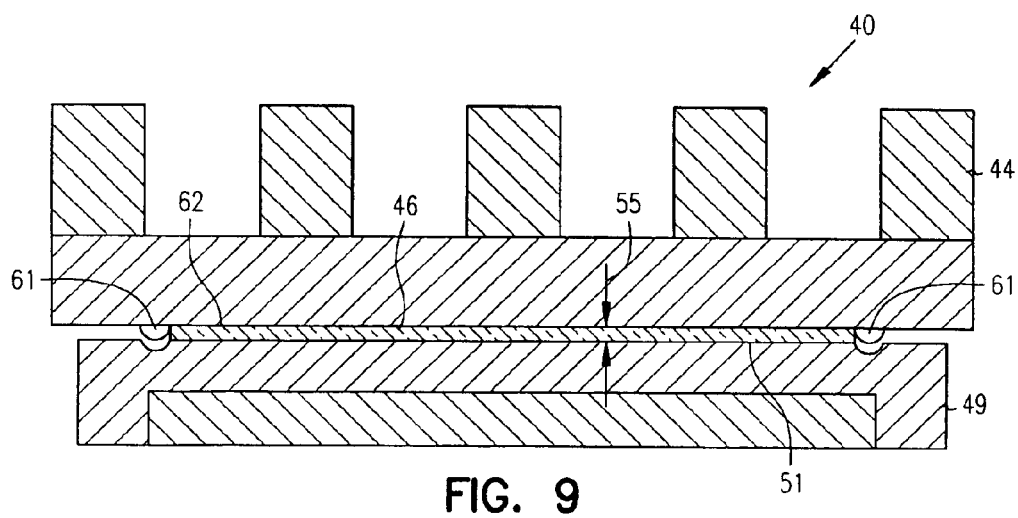
FIG. 9 is a simplified cross-section view illustrating yet another example embodiment of an electronic assembly encompassing the present invention.

It should be noted that although protrusions 60, 61 are shown as extending from heat sink 44 and heat spreader 49, there are other embodiments where one or more protrusions extend from only heat sink 44 or heat spreader 49. Protrusions 60, 61, as shown in FIG. 6, may also be used in combination with one or more cavities 50, as shown in FIGS. 3–5, on one, or both, of the heat sink 44 and heat spreader 49. Protrusions 60 (see FIG. 8), 61 (see FIG. 9) may fit partially, or wholly, within cavities 50. Thermal interface material 46, cavity 50 and protrusions 60, 61 may have any shape and are not limited to the square shape shown in FIG. 4.

Positioning cavities 50 and/or protrusions 60, 61 on a periphery of first and/or second surfaces 51, 62 maintains the high thermal performance of thermal interface material 46. When heat flows from heat spreader 49 to heat sink 44, almost all of the heat is transferred through an effective thermal area that extends outward from the center of the thermal connection between heat sink 44 and heat spreader 49. Since the cavity 50 and/or protrusions 60, 61 are predominately outside the effective thermal transfer area between heat sink 44 and heat spreader 49, the cavity 50 and/or protrusions 60, 61 do not significantly alter the heat transfer path. Therefore, adding a cavity 50 and/or protrusions 60, 61 to the periphery of first and second surfaces 51, 62 has little effect on the thermal performance of electronic assembly 40.

In some embodiments, the thickness of the thermal interface material depends on the type of thermal interface material. Thermal interface material 46 changes phases from a solid to a liquid during the initial operation of die 48 as the temperature of heat sink 44 and heat spreader 49 rises above a certain level. When die 48 is no longer operating, thermal interface material 46 cools and changes back into a solid to further bond heat sink 44 to integrated circuit package 42. The bond reduces the thermal impedance between the heat sink 44 and the integrated circuit package 42 over the life of the electronic assembly 40.

The present invention also relates to a kit of parts to form an electronic assembly 40. The kit includes an integrated circuit, such as die 48, and a package 42 adapted to be coupled to die 48. The kit further includes a heat sink 44 and a thermal interface material 46 that is adapted to be positioned between a first surface 51 on package 42 and a second surface 62 on the heat sink 44. At least one of the first and second surfaces 51, 62 includes a cavity 50 that receives excess thermal interface material 46 as heat sink 44 is compressed against package 42. In an alternative form of the kit, at least one of the first and second surfaces 51, 62 on heat sink 44 and package 42 includes a protrusion 60, 61 that maintains bond line thickness 55 between heat sink 44 and package 42 when heat sink 44 is thermally engaged with package 42.

Alternative materials may be used for heat sink 44, spreader 49 and thermal interface material 46. The choice of materials will depend on the relevant heat transfer considerations and the costs that are associated with fabricating electronic assembly 40.

Assembling a heat sink assembly using a kit of parts as described herein allows a heat sink to be assembled to a variety of industry standard integrated circuit packages from a single kit. The electronic assembly is fabricated by selecting the appropriate components based on the space available and the particular thermal situation.

Figure 7:
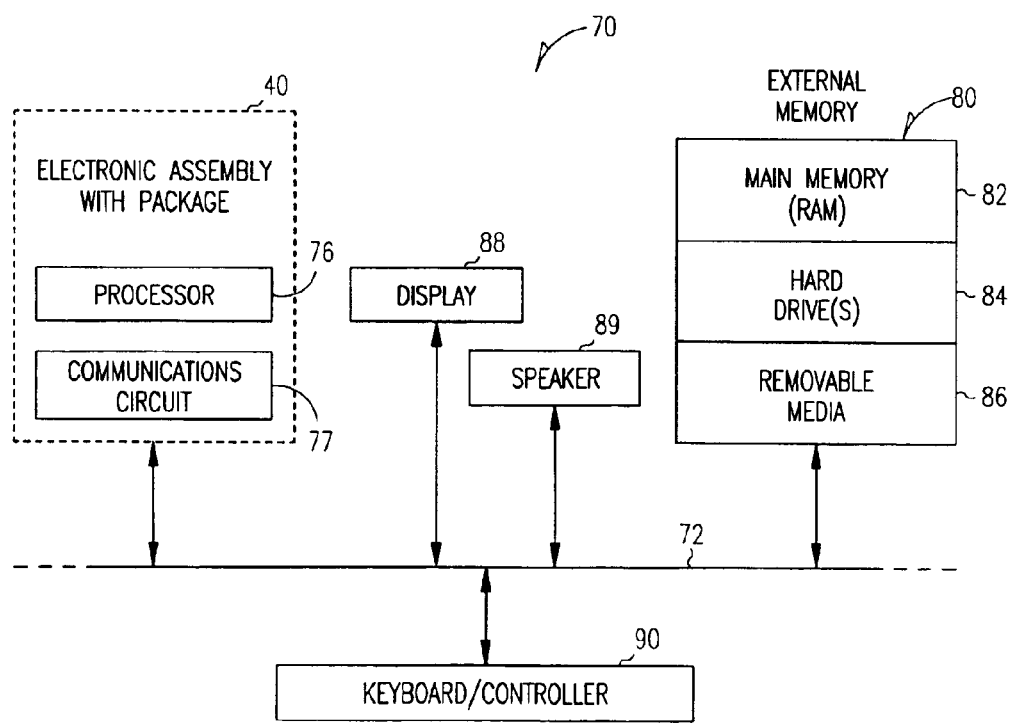
FIG. 7 is a block diagram of an electronic system incorporating at least one electronic assembly in accordance with the present invention.

FIG. 7 is a block diagram of an electronic system 70 incorporating at least one electronic assembly, such as an electronic assembly 40 illustrated in FIGS. 3–6. Electronic system 70 may be a computer system that includes a system bus 72 to electrically couple the various components of electronic system 70 together. System bus 72 may be a single bus or any combination of busses.

Electronic assembly 40 is coupled to system bus 72 and may include any circuit, or combination of circuits. In one embodiment, electronic assembly 40 includes a processor 76 which can be of any type. As used herein, processor means any type of circuit such as, but not limited to, a microprocessor, a microcontroller, a graphics processor or a digital signal processor.

Other types of circuits that can be included in electronic assembly 40 are a custom circuit or an application-specific integrated circuit, such as communications circuit 77 for use in wireless devices such as cellular telephones, pagers, portable computers, two-way radios, and similar electronic systems.

The electronic system 70 may also include an external memory 80 that in turn may include one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 90.

As shown herein, the present invention can be implemented in a number of different embodiments, including an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

FIGS. 1–7 are merely representational and are not drawn to scale. Certain proportions thereof may be exaggerated, especially as to cavity 50 and protrusions 60, 61, while others may be minimized.

The heat sink assembly and kit described above provide a universally applicable thermal solution for high heat generating electronic devices. The universal applicability supplies thermal engineers with a multitude of options for cooling an electronic device such as a high-powered processor.

Many other embodiments will be apparent to those of skill in the art from the above description. The scope of the invention should be determined with reference to the appended claims along with the full scope of equivalents to which such claims are entitled.

What is claimed is:

1. An electronic assembly comprising:
   an integrated circuit;
   a package connected to the integrated circuit, the package including a first surface;
   a heat sink including a second surface; and
   a thermal interface material between the first and second surfaces, at least one of the first and second surfaces including a cavity that collects excess thermal interface material as the heat sink is compressed against the package.

2. The electronic assembly of claim 1, wherein the integrated circuit is a die.

3. The electronic assembly of claim 1, wherein the first surface includes an outer edge and the cavity is concentric with the outer edge.

4. The electronic assembly of claim 1, wherein both of the first and second surfaces include a cavity that receives excess thermal interface material as the heat sink is compressed against the package.

5. The electronic assembly of claim 4, wherein the cavity on the first surface is aligned with the cavity on the second surface.

6. The electronic assembly of claim 1, wherein the package comprises a heat spreader that includes the first surface.

7. An electronic assembly comprising:
   an integrated circuit;
   a package connected to the integrated circuit, the package including a first surface;
   a heat sink including a second surface; and
   a thermal interface material between the first and second surfaces, each of the first and second surfaces including a cavity that collects excess thermal interface material as the heat sink is compressed against the package.

8. The electronic assembly of claim 7, wherein the integrated circuit is a die.

9. The electronic assembly of claim 7, wherein the cavity on the first surface is aligned with the cavity on the second surface.

10. The electronic assembly of claim 7, wherein the first surface includes an outer edge such that the cavity in the first surface is concentric with the outer edge.

11. The electronic assembly of claim 10, wherein the second surface includes an outer edge such that the cavity in the second surface is concentric with the outer edge.

12. The electronic assembly of claim 7, wherein the package includes a heat spreader that includes the first surface.

13. A computer system comprising:
   a bus;
   a memory coupled to the bus; and
   an electronic assembly including a heat sink, a thermal interface material, and a processor that is within a package which is electrically connected to the bus, the package including a first surface and the heat sink including a second surface with the thermal interface material between the first and second surfaces, at least one of the first and second surfaces including a cavity that collects excess thermal interface material as the heat sink is compressed against the package.

14. The computer system of claim 13, wherein the first surface includes an outer edge and the cavity is concentric with the outer edge.

15. The computer system of claim 13, wherein the package includes a heat spreader that includes the first surface.

16. The computer system of claim 13, wherein both of the first and second surfaces include a cavity that receives excess thermal interface material as the heat sink is compressed against the package.

17. The computer system of claim 16, wherein the cavity on the first surface is aligned with the cavity on the second surface.

18. A computer system comprising:

a bus;

a memory coupled to the bus; and an electronic assembly including a heat sink, a thermal interface material, and a processor that is within a package which is electrically connected to the bus, the package including a first surface and the heat sink including a second surface with the thermal interface material between the first and second surfaces, each of the first and second surfaces including a cavity that collects excess thermal interface material as the heat sink is compressed against the package.

19. The computer system of claim 18, wherein at least one of the first and second surfaces includes an additional cavity that collects excess thermal interface material as the heat sink is compressed against the package.

20. The computer system of claim 18, wherein the cavity on the first surface is aligned with the cavity on the second surface.

* * * * *